United States Patent
Jadric et al.

(10) Patent No.: US 10,859,300 B2
(45) Date of Patent: Dec. 8, 2020

(54) VARIABLE SPEED DRIVE FOR A HVACANDR SYSTEM

(71) Applicant: Johnson Controls Technology Company, Auburn Hills, MI (US)

(72) Inventors: Ivan Jadric, York, PA (US); Ajit W. Kane, York, PA (US)

(73) Assignee: Johnson Controls Technology Company, Auburn Hills, MI (US)

( * ) Notice: Subject to any disclaimer, the term of this patent is extended or adjusted under 35 U.S.C. 154(b) by 0 days.

(21) Appl. No.: 16/339,332

(22) PCT Filed: Oct. 5, 2017

(86) PCT No.: PCT/US2017/055381
§ 371 (c)(1),
(2) Date: Apr. 3, 2019

(87) PCT Pub. No.: WO2018/067843
PCT Pub. Date: Apr. 12, 2018

(65) Prior Publication Data
US 2020/0041185 A1  Feb. 6, 2020

Related U.S. Application Data

(60) Provisional application No. 62/404,648, filed on Oct. 5, 2016.

(51) Int. Cl.
*F25B 49/02* (2006.01)
*H02P 27/06* (2006.01)
(Continued)

(52) U.S. Cl.
CPC ............ *F25B 49/025* (2013.01); *H02P 27/06* (2013.01); *H01L 29/1608* (2013.01); *H01L 29/7801* (2013.01)

(58) Field of Classification Search
CPC ...... H02P 1/00; H02P 1/04; H02P 1/46; H02P 1/24; H02P 3/00; H02P 3/18; H02P 21/00;
(Continued)

(56) References Cited

U.S. PATENT DOCUMENTS 7,555,912 B2   7/2009   Schnetzka et al.
7,619,906 B2   11/2009  Schnetzka
(Continued)

FOREIGN PATENT DOCUMENTS

EP   1950885 B1   6/2010
EP   2093870 B1   9/2011
(Continued)

OTHER PUBLICATIONS

Mashaly, et al., System Solution: "SiC-Inverter for Industrial Motor Drive"., Cover Story, Bodo's Power Systems, Sic Inverter for Industrial Motor Drive, Mar. 2016, ISSN: 1863-5598, ZKZ 64717, 4 pgs.
(Continued)

*Primary Examiner* — Antony M Paul
(74) *Attorney, Agent, or Firm* — Fletcher Yoder, P.C.

(57) ABSTRACT

Embodiments of the present disclosure relate to a heating, ventilating, air conditioning, and refrigeration (HVAC&R) system that includes a variable speed drive configured to provide power to a motor that drives a compressor of the HVAC&R system and a silicon carbide transistor of the variable speed drive, where the silicon carbide transistor is configured to adjust a voltage, or a frequency, or both of power flowing through the variable speed drive.

15 Claims, 6 Drawing Sheets

(51) Int. Cl.
*H01L 29/16* (2006.01)
*H01L 29/78* (2006.01)

(58) Field of Classification Search
CPC .......... H02P 23/00; H02P 25/00; H02P 27/00; H02P 27/04; H02P 27/06; H02P 27/08; H02P 6/00; H02P 6/12; H02P 6/14; H01L 29/1608
USPC .... 318/400.01, 400.02, 400.14, 400.15, 700, 318/701, 721, 779, 799, 800, 801, 430, 318/432, 599, 811
See application file for complete search history.

(56) References Cited

U.S. PATENT DOCUMENTS

| | | | |
|---|---|---|---|
| 7,965,484 B2 | 6/2011 | Baudesson et al. | |
| 8,040,648 B2 | 10/2011 | Baudesson | |
| 8,193,660 B2* | 6/2012 | Rockenfeller | F25B 49/022 165/58 |
| 8,299,646 B2* | 10/2012 | Rockenfeller | H02P 5/74 165/58 |
| 8,446,747 B2* | 5/2013 | Cadoux | H02M 1/36 363/132 |
| 8,830,021 B2* | 9/2014 | MacLennan | H02M 1/12 336/178 |
| 9,077,274 B2 | 7/2015 | Shinomoto et al. | |
| 9,228,750 B2* | 1/2016 | Rockenfeller | F24F 3/00 |
| 9,651,289 B2 | 5/2017 | Hatakeyama et al. | |
| 9,739,515 B2 | 8/2017 | Kamiya et al. | |
| 9,746,216 B2 | 8/2017 | Yamakawa et al. | |
| 9,772,131 B2 | 9/2017 | Hatakeyama et al. | |
| 9,829,234 B2 | 11/2017 | Hatakeyama et al. | |
| 9,859,808 B2 | 1/2018 | Wagoner et al. | |
| 9,903,629 B2 | 2/2018 | Kamiya et al. | |
| 9,935,569 B2 | 4/2018 | Tsumura et al. | |
| 2011/0018349 A1* | 1/2011 | Rockenfeller | F25B 49/022 307/66 |
| 2011/0084674 A1* | 4/2011 | Cadoux | H02M 1/36 323/282 |
| 2013/0308351 A1* | 11/2013 | MacLennan | H01F 27/027 363/34 |
| 2014/0338379 A1 | 11/2014 | Hatakeyama et al. | |
| 2014/0338380 A1 | 11/2014 | Kamiya et al. | |
| 2016/0200171 A1 | 7/2016 | Nagasaka et al. | |
| 2016/0204689 A1 | 7/2016 | Wennerstrom et al. | |
| 2016/0245571 A1* | 8/2016 | Shinomoto | H02M 3/158 |
| 2016/0294312 A1* | 10/2016 | Tsumura | H02M 5/458 |
| 2017/0016655 A1* | 1/2017 | Shinomoto | H02M 1/42 |
| 2017/0237380 A1 | 8/2017 | Hatakeyama | |

FOREIGN PATENT DOCUMENTS

| | | |
|---|---|---|
| EP | 2469201 A2 | 6/2012 |
| EP | 2629029 A1 | 8/2013 |
| EP | 2657626 A1 | 10/2013 |
| EP | 2703748 A1 | 3/2014 |
| EP | 3054585 A1 | 8/2016 |
| JP | 2006042529 A | 2/2006 |
| JP | 2008061414 A | 3/2008 |
| JP | 2010166719 A | 7/2010 |
| JP | WO2016071965 A1 | 4/2017 |
| WO | 2014113777 A1 | 7/2014 |

OTHER PUBLICATIONS

International Search Report and Written Opinion for PCT Application No. PCT/US2017/055381 dated Jan. 15, 2018, 17 pgs.
Japanese Office Action for JP Application No. 2019-518113, dated Jul. 22, 2020, 3 pgs.

* cited by examiner

VARIABLE SPEED DRIVE FOR A HVACANDR SYSTEM

CROSS REFERENCE TO RELATED APPLICATIONS

This application claims priority to and the benefit of U.S. Provisional Application Ser. No. 62/404,648, filed Oct. 5, 2016, entitled "SILICON CARBIDE MODULE FOR A VARIABLE SPEED DRIVE," which is hereby incorporated by reference in its entirety for all purposes.

BACKGROUND

This application relates generally to heating, ventilating, air conditioning, and refrigeration (HVAC&R) systems, and, more particularly, to a variable speed drive of a HVAC&R system.

HVAC&R systems are utilized in residential, commercial, and industrial environments to control environmental properties, such as temperature and humidity, for occupants of the respective environments. In some cases, the HVAC&R system may include a vapor compression system, which circulates a working fluid along a refrigerant loop. The working fluid is configured to change phases between vapor, liquid, and combinations thereof in response to being subjected to different temperatures and pressures associated with operation of the vapor compression system. For example, the vapor compression system utilizes a compressor to circulate the working fluid to a heat exchanger which may transfer heat between the refrigerant and another fluid flowing through the heat exchanger. In some cases, the compressor is driven by a motor, which receives power from a variable speed drive. Existing variable speed drives for HVAC&R systems may incur switching losses because of relatively slow switching times of insulated-gate bipolar transistors (IGBTs) between an open and a closed position during operation of the variable speed drive.

SUMMARY

In one embodiment a heating, ventilating, air conditioning, and refrigeration (HVAC&R) system includes a variable speed drive configured to provide power to a motor that drives a compressor of the HVAC&R system and a silicon carbide transistor of the variable speed drive, where the silicon carbide transistor is configured to adjust a voltage, or a frequency, or both of power flowing through the variable speed drive.

In another embodiment a system includes a compressor of a heating, ventilating, air conditioning, and refrigeration (HVAC&R) system configured to circulate a refrigerant through a refrigerant loop, a motor configured to drive the compressor of the HVAC&R system, a variable speed drive configured to provide power to the motor, where the variable speed drive includes a rectifier, a direct current (DC) bus, and an inverter, and a silicon carbide transistor disposed in the rectifier, or the inverter, or both, where the silicon carbide transistor is configured to adjust a voltage, or a frequency, or both of alternating current (AC) power in the variable speed drive.

In another embodiment a method includes circulating a refrigerant through a refrigerant loop with a compressor and supplying power to a motor with a variable speed drive, wherein the motor is configured to drive the compressor, and where the variable speed drive comprises a silicon carbide transistor.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Embodiments of the present disclosure are directed towards a heating, ventilating, air conditioning, and refrigeration (HVAC&R) system that uses a variable speed drive having a silicon carbide transistor. Variable speed drives may be coupled to a motor that drives a compressor of the HVAC&R system. More specifically, variable speed drives may be utilized to adjust a speed of the motor. Typically, HVAC&R systems utilize significant amounts of power. Accordingly, enhancing the efficiency of such systems may reduce operating costs by reducing an amount of energy consumed and/or reducing energy loss incurred during operation.

Variable speed drives may incur losses during operation due to conduction losses and/or switching losses. For example, conduction losses may occur when components of the variable speed drive conduct current (e.g., an insulated-gate bipolar transistor (IGBT) conducts current when in a closed state). Additionally, switching losses may occur when components of the variable speed drive (e.g., an insulated-gate bipolar transistor (IGBT)) switch between an open and a closed state during operation of the variable speed drive.

Typically, switching components of the variable speed drive, such as an IGBT module, which also includes a silicon diode. Silicon diodes may be relatively inexpensive, but also have relatively slow switching times. Accordingly, an efficiency of the variable speed drive may be reduced as a result of the switching time for the silicon diode to switch between an open and a closed position.

Embodiments of the present disclosure relate to variable speed drives that include a silicon carbide transistor in lieu of an IGBT. The silicon carbide transistor may reduce switching losses because the silicon carbide transistor includes a more efficient (e.g., faster) switching time when compared to IGBTs. Incorporating the silicon carbide transistor into variable speed drives may enhance an efficiency of the variable speed drive, and thus, increase the efficiency of the overall HVAC&R system.

Figure 1:
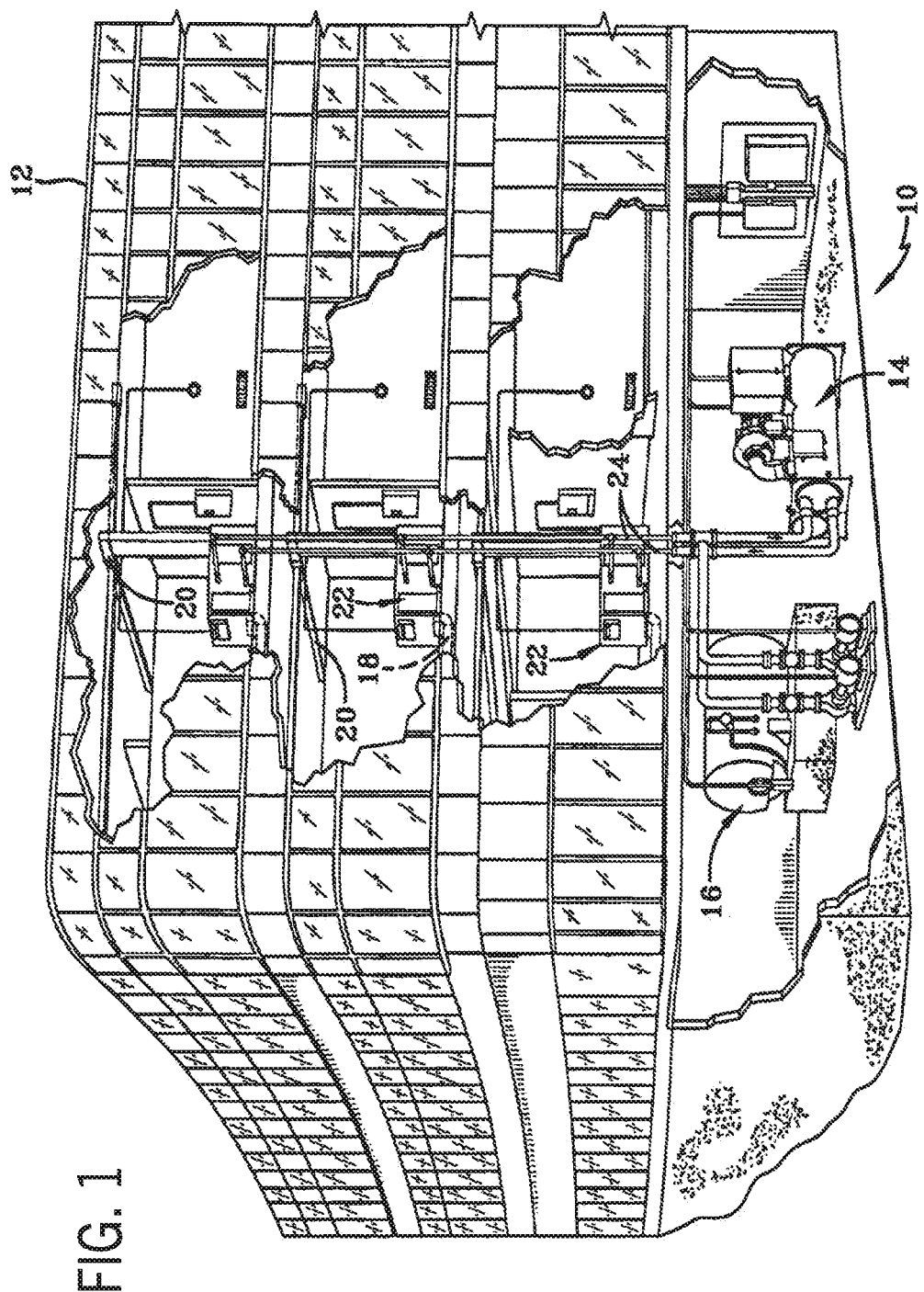
FIG. 1 is a perspective view of an embodiment of a building that may utilize a heating, ventilation, air conditioning, and refrigeration (HVAC&R) system in a commercial setting, in accordance with an aspect of the present disclosure.

Turning now to the drawings, FIG. 1 is a perspective view of an embodiment of an environment for a heating, ventilation, air conditioning, and refrigeration (HVAC&R) system 10 in a building 12 for a typical commercial setting. The HVAC&R system 10 may include a vapor compression system 14 that supplies a chilled liquid, which may be used to cool the building 12. The HVAC&R system 10 may also include a boiler 16 to supply warm liquid to heat the building 12 and an air distribution system which circulates air through the building 12. The air distribution system can also include an air return duct 18, an air supply duct 20, and/or an air handler 22. In some embodiments, the air handler 22 may include a heat exchanger that is connected to the boiler 16 and the vapor compression system 14 by conduits 24. The heat exchanger in the air handler 22 may receive either heated liquid from the boiler 16 or chilled liquid from the vapor compression system 14, depending on the mode of operation of the HVAC&R system 10. The HVAC&R system 10 is shown with a separate air handler on each floor of building 12, but in other embodiments, the HVAC&R system 10 may include air handlers 22 and/or other components that may be shared between or among floors.

Figure 2:
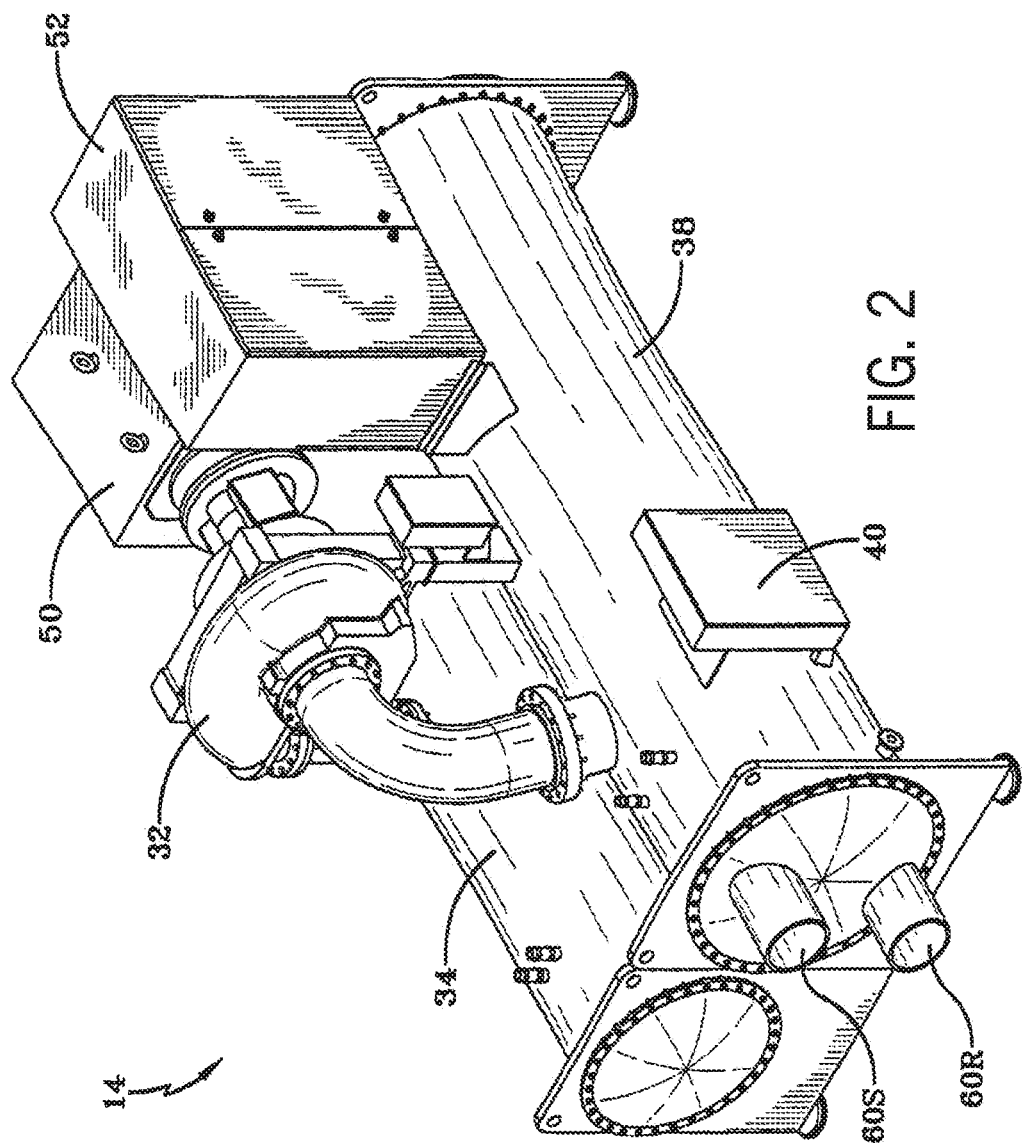
FIG. 2 is a perspective view of a vapor compression system, in accordance with an aspect of the present disclosure.
Figure 3:
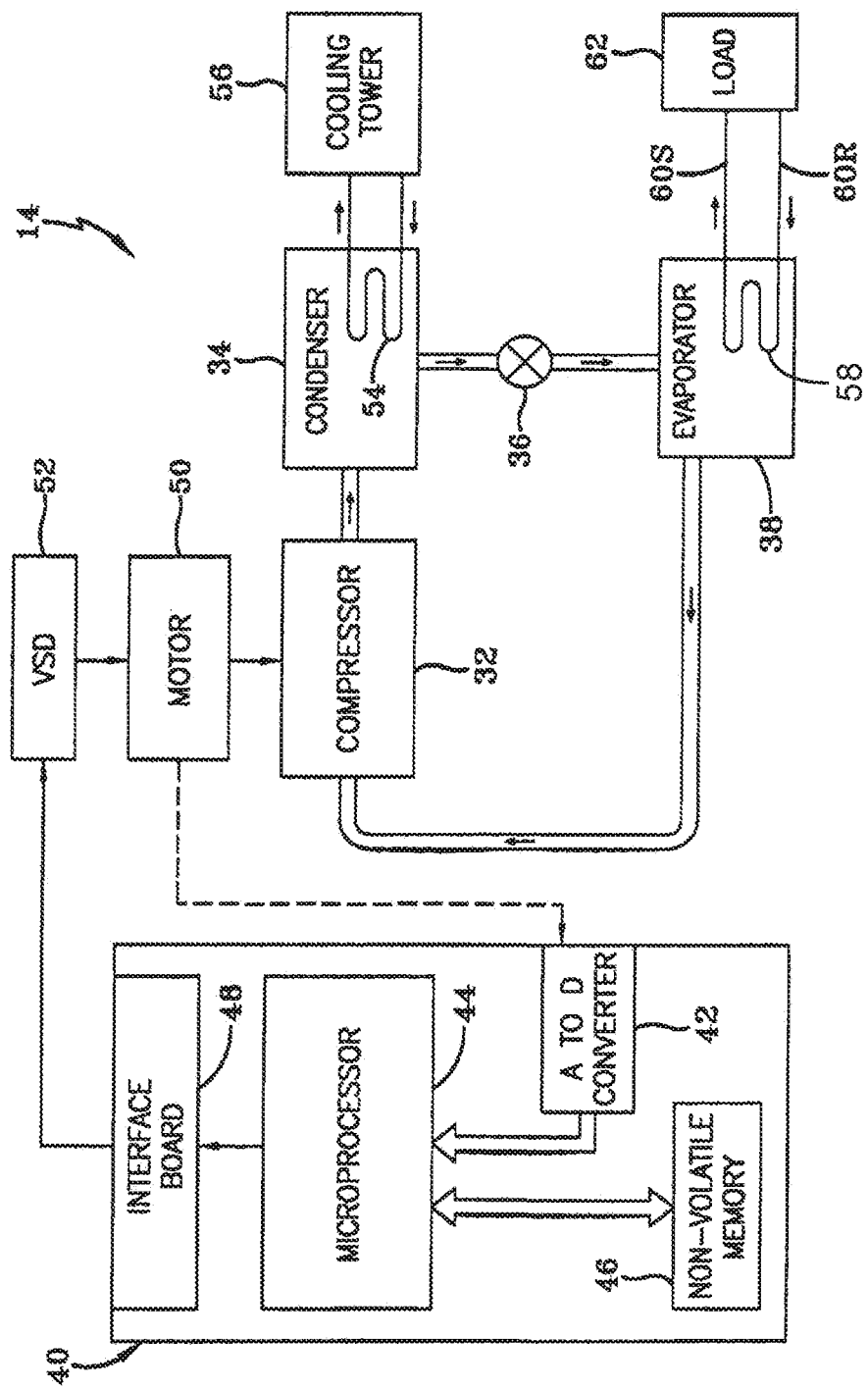
FIG. 3 is a schematic of an embodiment of the vapor compression system of FIG. 2, in accordance with an aspect of the present disclosure.

FIGS. 2 and 3 are embodiments of the vapor compression system 14 that can be used in the HVAC&R system 10. The vapor compression system 14 may circulate a refrigerant through a circuit starting with a compressor 32. The circuit may also include a condenser 34, an expansion valve(s) or device(s) 36, and a liquid chiller or an evaporator 38. The vapor compression system 14 may further include a control panel 40 that has an analog to digital (A/D) converter 42, a microprocessor 44, a non-volatile memory 46, and/or an interface board 48.

Some examples of fluids that may be used as refrigerants in the vapor compression system 14 are hydrofluorocarbon (HFC) based refrigerants, for example, R-410A, R-407, R-134a, hydrofluoro olefin (HFO), "natural" refrigerants like ammonia ($NH_3$), R-717, carbon dioxide ($CO_2$), R-744, or hydrocarbon based refrigerants, water vapor, or any other suitable refrigerant. In some embodiments, the vapor compression system 14 may be configured to efficiently utilize refrigerants having a normal boiling point of about 19 degrees Celsius (66 degrees Fahrenheit) at one atmosphere of pressure, also referred to as low pressure refrigerants, versus a medium pressure refrigerant, such as R-134a. As used herein, "normal boiling point" may refer to a boiling point temperature measured at one atmosphere of pressure.

In some embodiments, the vapor compression system 14 may use one or more of a variable speed drive (VSDs) 52, a motor 50, the compressor 32, the condenser 34, the expansion valve or device 36, and/or the evaporator 38. The motor 50 may drive the compressor 32 and may be powered by a variable speed drive (VSD) 52. The VSD 52 receives alternating current (AC) power having a particular fixed line voltage and fixed line frequency from an AC power source, and provides power having a variable voltage and frequency to the motor 50. In other embodiments, the motor 50 may be powered directly from an AC or direct current (DC) power source. The motor 50 may include any type of electric motor that can be powered by a VSD or directly from an AC or DC power source, such as a switched reluctance motor, an induction motor, an electronically commutated permanent magnet motor, or another suitable motor.

The compressor 32 compresses a refrigerant vapor and delivers the vapor to the condenser 34 through a discharge passage. In some embodiments, the compressor 32 may be a centrifugal compressor. The refrigerant vapor delivered by the compressor 32 to the condenser 34 may transfer heat to a cooling fluid (e.g., water or air) in the condenser 34. The refrigerant vapor may condense to a refrigerant liquid in the condenser 34 as a result of thermal heat transfer with the cooling fluid. The liquid refrigerant from the condenser 34 may flow through the expansion device 36 to the evaporator 38. In the illustrated embodiment of FIG. 3, the condenser 34 is water cooled and includes a tube bundle 54 connected to a cooling tower 56, which supplies the cooling fluid to the condenser.

The liquid refrigerant delivered to the evaporator 38 may absorb heat from another cooling fluid, which may or may not be the same cooling fluid used in the condenser 34. The liquid refrigerant in the evaporator 38 may undergo a phase change from the liquid refrigerant to a refrigerant vapor. As shown in the illustrated embodiment of FIG. 3, the evaporator 38 may include a tube bundle 58 having a supply line 60S and a return line 60R connected to a cooling load 62. The cooling fluid of the evaporator 38 (e.g., water, ethylene glycol, calcium chloride brine, sodium chloride brine, or any other suitable fluid) enters the evaporator 38 via return line 60R and exits the evaporator 38 via supply line 60S. The evaporator 38 may reduce the temperature of the cooling fluid in the tube bundle 58 via thermal heat transfer with the refrigerant. The tube bundle 58 in the evaporator 38 can include a plurality of tubes and/or a plurality of tube bundles. In any case, the vapor refrigerant exits the evaporator 38 and returns to the compressor 32 by a suction line to complete the cycle.

Figure 4:
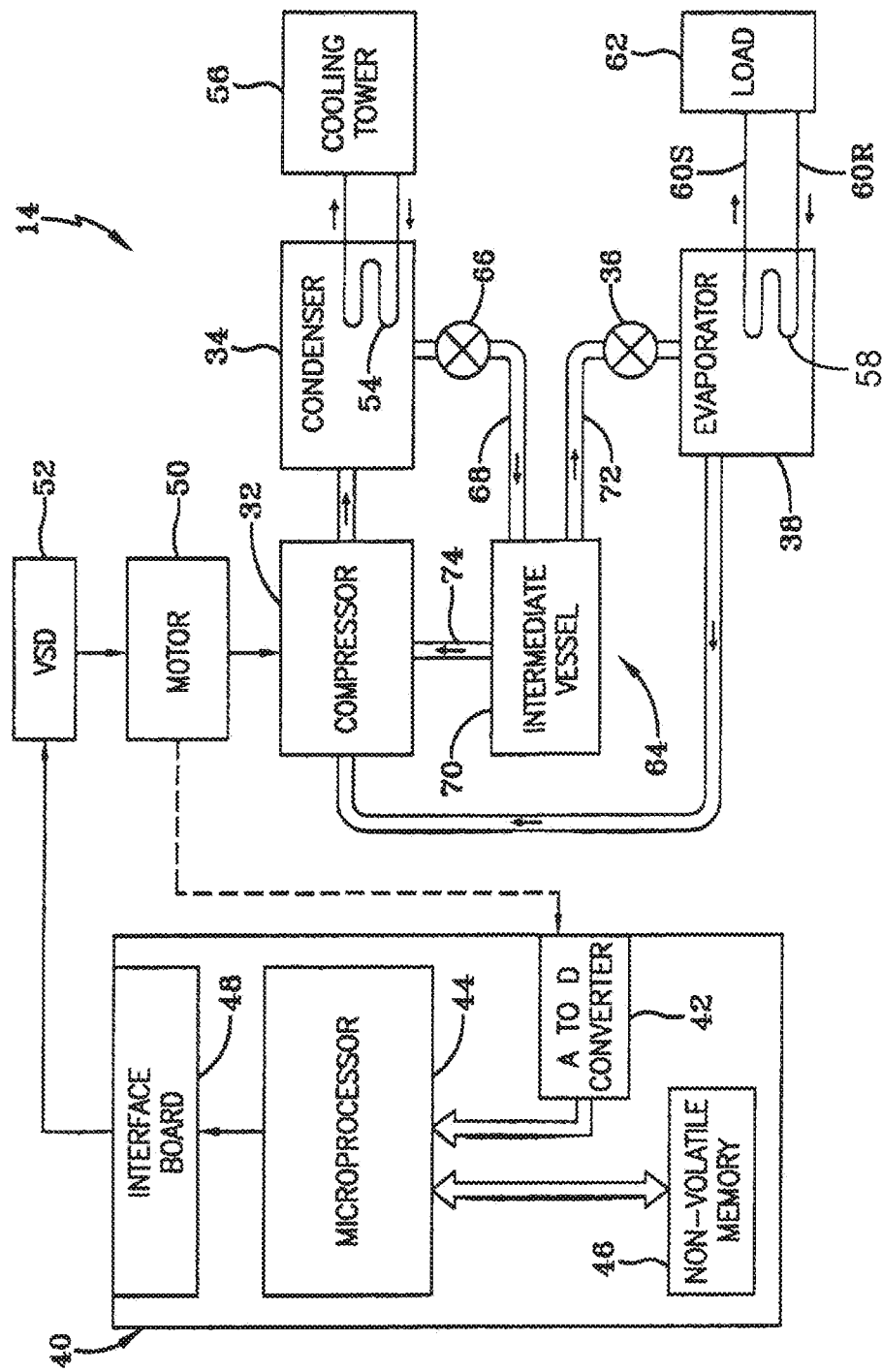
FIG. 4 is a schematic of an embodiment of the vapor compression system of FIG. 2, in accordance with an aspect of the present disclosure.

FIG. 4 is a schematic of the vapor compression system 14 with an intermediate circuit 64 incorporated between condenser 34 and the expansion device 36. The intermediate circuit 64 may have an inlet line 68 that is directly fluidly connected to the condenser 34. In other embodiments, the inlet line 68 may be indirectly fluidly coupled to the condenser 34. As shown in the illustrated embodiment of FIG. 4, the inlet line 68 includes a first expansion device 66 positioned upstream of an intermediate vessel 70. In some embodiments, the intermediate vessel 70 may be a flash tank (e.g., a flash intercooler). In other embodiments, the intermediate vessel 70 may be configured as a heat exchanger or a "surface economizer." In the illustrated embodiment of FIG. 4, the intermediate vessel 70 is used as a flash tank, and the first expansion device 66 is configured to lower the pressure of (e.g., expand) the liquid refrigerant received from the condenser 34. During the expansion process, a portion of the liquid may vaporize, and thus, the intermediate vessel 70 may be used to separate the vapor from the liquid received from the first expansion device 66. Additionally, the intermediate vessel 70 may provide for further expansion of the liquid refrigerant because of a pressure drop experienced by the liquid refrigerant when entering the intermediate vessel 70 (e.g., due to a rapid increase in volume experienced when entering the intermediate vessel 70). The vapor in the intermediate vessel 70 may be drawn by the compressor 32 through a suction line 74 of the compressor 32. In other embodiments, the vapor in the intermediate vessel may be drawn to an intermediate stage of the compressor 32 (e.g., not the suction stage). The liquid that collects in the intermediate vessel 70 may be at a lower enthalpy than the liquid refrigerant exiting the condenser 34 because of the expansion in the expansion device 66 and/or the intermediate vessel 70. The liquid from intermediate vessel 70 may then flow in line 72 through a second expansion device 36 to the evaporator 38.

As noted above, variable speed drives may incur conduction losses and/or switching losses during operation, which leads to a reduction in an efficiency of the variable speed drive. Conduction losses occur when a component of a variable speed drive is conducting electrical current (e.g., when an IGBT is in a closed state). As such, energy input to the variable speed drive is lost in the form of thermal energy (e.g., heat). Additionally, switching losses occur when a component of a variable speed drive transitions between open and closed states (e.g., to adjust an amount or voltage or frequency of power supplied to the motor). For example, a transistor of the variable speed drive may be adjusted between an open and a closed state to adjust a voltage and/or frequency of power ultimately output to the motor. Existing variable speed drives include insulated-gate bipolar transistors (IGBTs), which may include relatively slow switching speeds. Accordingly, an efficiency of the variable speed drive is reduced as a result of the switching speeds of the IGBTs. Embodiments of the present disclosure relate to variable speed drives that have a silicon carbide transistor. The silicon carbide transistor includes quicker switching speeds when compared to IGBTs of existing variable speed drives. Accordingly, including silicon carbide transistors in the variable speed drive may enhance an efficiency of the variable speed drive, and thus, increase an overall efficiency of a HVAC&R system.

Figure 5:
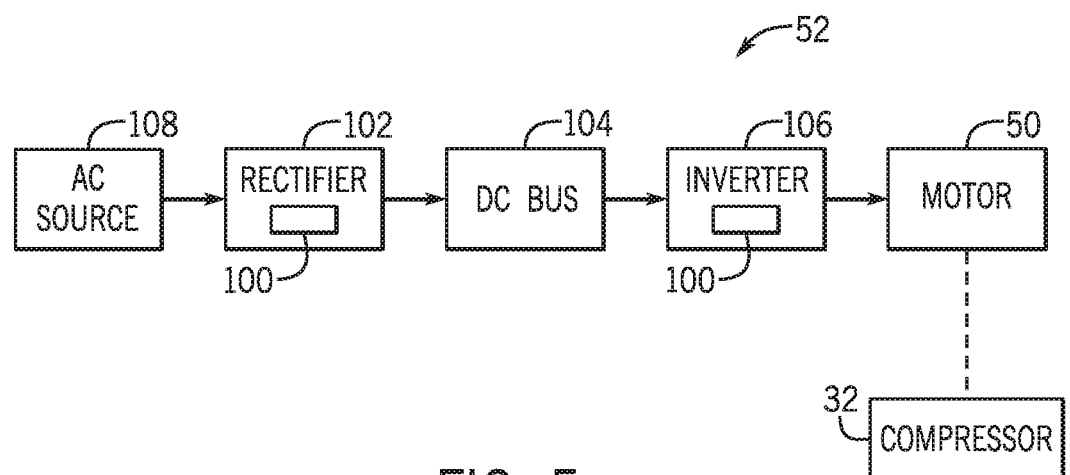
FIG. 5 is a schematic of an embodiment of a variable speed drive that may be used with the vapor compression system of FIGS. 2-4, in accordance with an aspect of the present disclosure.

For example, FIG. 5 is a schematic of the variable speed drive 52 that includes a silicon carbide transistor 100. As shown in the illustrated embodiment of FIG. 5, the variable speed drive 52 includes a rectifier 102, a DC bus 104, and an inverter 106. The rectifier 102 receives alternating current (AC) power at a constant voltage and frequency and converts the AC power into direct current (DC) power. For example, the rectifier 102 may receive the AC power from an AC power source 108, which may supply three-phase AC power to the variable speed drive 52. The DC bus 104 may then filter and/or stabilize the DC power, such that the DC power is suitable for use by the inverter 106. The inverter 106 may then transfer the DC power back to AC power that includes a variable voltage and frequency. The AC power from the inverter 106 is utilized to power the motor 50, which drives the compressor 32 of the vapor compression system 14.

As shown in the illustrated embodiment of FIG. 5, the silicon carbide transistor 100 is included in the rectifier 102 and/or the inverter 106. As such, the silicon carbide transistor 100 may be utilized to adjust an amount of voltage and/or frequency of the power that is directed to the DC bus 104 and/or the motor 50. In some embodiments, the voltage and/or frequency of the power is based on a voltage of the AC power from the AC power source 108, a voltage of the DC power at the DC bus 104, a speed of the motor 50, a discharge pressure of the compressor 32, or a combination thereof. In any case, the silicon carbide transistor 100 includes a reduced switching speed when compared to existing IGBTs. As such, the variable speed drive efficiency is enhanced and the overall efficiency of the vapor compression system 14 may also increase.

Figure 6:
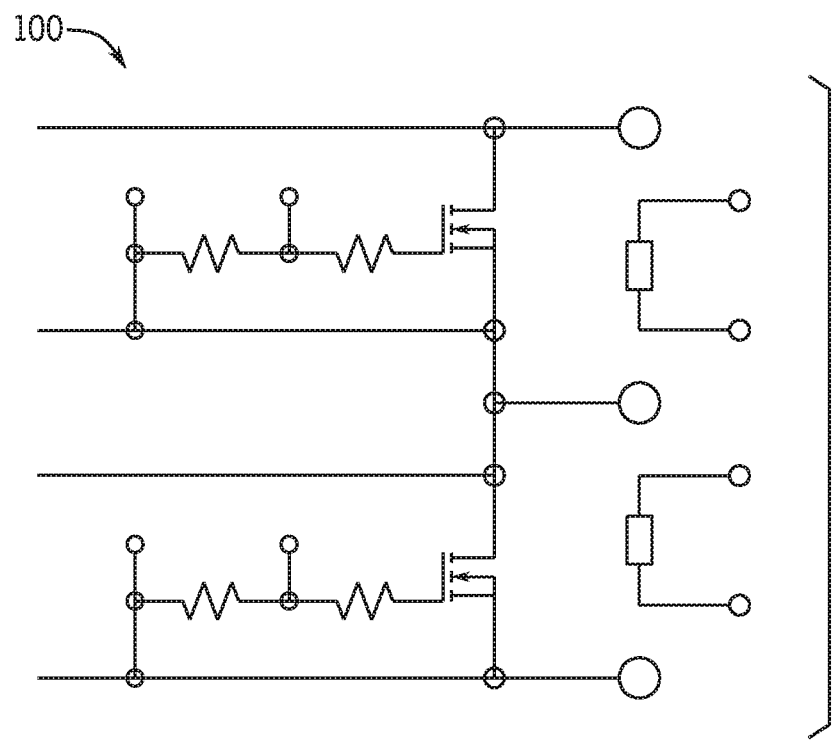
FIG. 6 is a circuit diagram of an embodiment of a silicon carbide transistor that may be used with the variable speed drive of FIG. 5, in accordance with an aspect of the present disclosure.

FIG. 6 is a circuit diagram of an embodiment of the silicon carbide transistor 100 that may be included in the variable speed drive 52 of the vapor compression system 14. In some embodiments, an IGBT having a silicon diode may be replaced with the silicon carbide transistor 100 (e.g., a metal-oxide-semiconductor field-effect transistor (MOSFET)). In some embodiments, a circuit board of the variable speed drive 52 may be modified in order to include the silicon carbide transistor 100 into the variable speed drive 52 and improve the efficiency of the variable speed drive 52. Specifically, a circuit board and/or a gate driver board of the variable speed drive 52 may be modified to implement the silicon carbide transistor 100. Additionally, electromagnetic filters and/or other magnetic filters may be included in the circuit board or other suitable locations in the variable speed drive 52 to accommodate the silicon carbide transistor 100. A cooling system of the variable speed drive 52 may also be modified as a result of less thermal energy being created by the silicon carbide transistor 100 when compared to IGBTs. In any case, the silicon carbide transistor 100 may reduce switching losses, thereby increasing an efficiency of the variable speed drive 52.

As discussed above, losses incurred by the variable speed drive 52 with the silicon carbide transistor 100 are significantly less than those incurred by the variable speed drive with the typical IGBT with a silicon diode. As such, the variable speed drive 52 that includes the silicon carbide transistor 100 achieves an improved efficiency over the variable speed drives that include a typical IGBT with a silicon diode. For example, the variable speed drive 52 may improve an efficiency of the vapor compression system 14 between 0.25% and 3%, between 0.4% and 2%, or between 0.5% and 1.6%. As is understood, the vapor compression system 14 may consume relatively large amounts of power. As such, improvements in efficiency that are between 0.5% and 1.6% may significantly reduce an amount of power consumption by the vapor compression system 14, and thus, reduce operating costs of the vapor compression system 14. Accordingly, incorporating the silicon carbide transistor 100 into the variable speed drive 52 may improve the efficiency of the vapor compression system 14, and thus, reduce operating costs of the vapor compression system 14.

Figure 7:
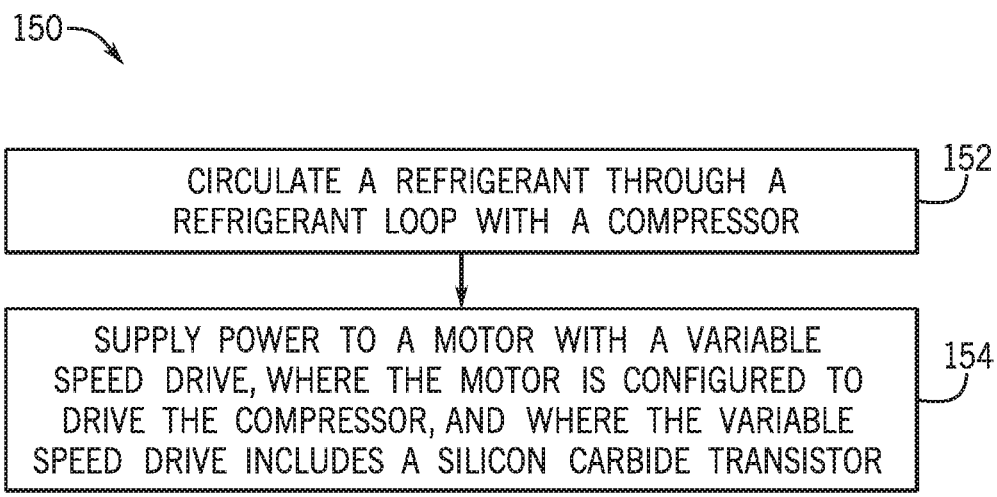
FIG. 7 is a block diagram of an embodiment of a process for operating a vapor compression system having the silicon carbide transistor of FIG. 6, in accordance with an aspect of the present disclosure.

FIG. 7 is a block diagram of an embodiment of a process 150 for operating the vapor compression system 14 having the variable speed drive 52 with the silicon carbide transistor 100. For example at block 152, the compressor 32 circulates refrigerant through the refrigerant loop of the vapor compression system 14. Additionally, at block 154, the variable speed drive 52 supplies power to the motor 50 to drive the compressor 32. As discussed above, the variable speed drive 52 includes the silicon carbide transistor 100, which reduces power losses (e.g., switching losses and/or conduction losses) and increases an efficiency of the vapor compression system 14.

As set forth above, the present disclosure may provide one or more technical effects useful in improving an efficiency of HVAC&R systems. Embodiments of the disclosure may include variable speed drives having a silicon carbide transistor, which may include reduced switching times when compared to existing IGBTs. As such, switching losses that occur during operation of the variable speed drive may be reduced, thereby enhancing an efficiency of variable speed drive, and thus, enhancing an efficiency of the overall HVAC&R system. The technical effects and technical problems in the specification are examples and are not limiting. It should be noted that the embodiments described in the specification may have other technical effects and can solve other technical problems.

While only certain features and embodiments have been illustrated and described, many modifications and changes may occur to those skilled in the art (e.g., variations in sizes, dimensions, structures, shapes and proportions of the various elements, values of parameters (e.g., temperatures, pressures, etc.), mounting arrangements, use of materials, colors, orientations, etc.) without materially departing from the novel teachings and advantages of the subject matter recited in the claims. The order or sequence of any process or method steps may be varied or re-sequenced according to alternative embodiments. It is, therefore, to be understood that the appended claims are intended to cover all such modifications and changes as fall within the true spirit of the disclosure. Furthermore, in an effort to provide a concise description of the exemplary embodiments, all features of an actual implementation may not have been described (i.e., those unrelated to the presently contemplated best mode of carrying out the disclosure, or those unrelated to enabling the claimed disclosure). It should be appreciated that in the development of any such actual implementation, as in any engineering or design project, numerous implementation specific decisions may be made. Such a development effort might be complex and time consuming, but would nevertheless be a routine undertaking of design, fabrication, and manufacture for those of ordinary skill having the benefit of this disclosure, without undue experimentation.

The invention claimed is:

1. A heating, ventilating, air conditioning, and refrigeration (HVAC&R) system, comprising:
    a variable speed drive configured to provide power to a motor configured to drive a compressor of the HVAC&R system; and
    a silicon carbide transistor of the variable speed drive, wherein the silicon carbide transistor is configured to adjust a voltage, or a frequency, or both, of power flowing through the variable speed drive; and
    a controller coupled to the silicon carbide transistor and configured to adjust a state of the silicon carbide transistor based on a discharge pressure of the compressor.

2. The system of claim 1, wherein the variable speed drive comprises:
    a rectifier configured to receive alternating current (AC) power from an AC power source and convert the AC power to direct current (DC) power, wherein the AC power comprises a constant voltage and a constant frequency;
    a DC bus configured to receive the DC power from the rectifier; and
    an inverter configured to receive the DC power from the DC bus and to convert the DC power to AC power having a variable voltage and a variable frequency.

3. The system of claim 1, wherein the silicon carbide transistor is disposed in the rectifier, or the inverter, or both.

4. The system of claim 2, wherein the AC power received from the AC power source is three-phase AC power.

5. The system of claim 1, wherein the silicon carbide transistor is a metal-oxide-semiconductor field-effect transistor (MOSFET).

6. The system of claim 1, comprising:
    the compressor configured to circulate a refrigerant through a refrigerant loop of the HVAC&R system; and
    a heat exchanger configured to place the refrigerant in thermal communication with a cooling fluid.

7. The system of claim 6, comprising an expansion device configured to reduce a pressure of the refrigerant flowing through the refrigerant loop of the HVAC&R system.

8. The system of claim 1, wherein the controller is configured to adjust the state of the silicon carbide transistor based on the discharge pressure of the compressor and a speed of the motor.

9. A system, comprising:
    a compressor of a heating, ventilating, air conditioning, and refrigeration (HVAC&R) system configured to circulate a refrigerant through a refrigerant loop;
    a motor configured to drive the compressor of the HVAC&R system;
    a variable speed drive configured to provide power to the motor, wherein the variable speed drive comprises a rectifier, a direct current (DC) bus, and an inverter;
    a silicon carbide transistor disposed in the rectifier, or the inverter, or both, wherein the silicon carbide transistor is configured to adjust a voltage, or a frequency, or both of alternating current (AC) power in the variable speed drive; and
    a controller coupled to the silicon carbide transistor and configured to adjust a state of the silicon carbide transistor based on a discharge pressure of the compressor.

10. The system of claim 9, wherein the rectifier is configured to receive three-phase alternating current (AC) power from an AC power source and to convert the three-phase AC power to DC power, wherein the AC power is constant voltage and constant frequency.

11. The system of claim 10, wherein the DC bus is configured to receive the
    DC power from the rectifier and to filter or stabilize the DC power.

12. The system of claim 9, wherein the inverter is configured to receive the DC power from the DC bus and to convert the DC power to AC power having a variable voltage and a variable frequency.

13. The system of claim 9, wherein the silicon carbide transistor is a metal-oxide-semiconductor field-effect transistor (MOSFET).

14. A method of operating a heating, ventilating, air conditioning, and refrigeration (HVAC&R) system, comprising:
    circulating a refrigerant through a refrigerant loop with a compressor;
    supplying power to a motor with a variable speed drive, wherein the motor is configured to drive the compressor, and wherein the variable speed drive comprises a silicon carbide transistor; and
    adjusting a frequency, or a voltage, or both of power in the variable speed drive using the silicon carbide transistor and based on a discharge pressure of the compressor.

15. The method of claim 14, comprising adjusting the frequency, or the voltage, or both of the power in the variable speed drive using the silicon carbide transistor and based on the discharge pressure of the compressor and a speed of the motor.

* * * * *